United States Patent
Yu

(10) Patent No.: US 7,406,146 B2
(45) Date of Patent: Jul. 29, 2008

(54) SHIFT REGISTER CIRCUIT

(75) Inventor: Jian-Shen Yu, Hsinchu (TW)

(73) Assignee: Au Optronics Corporation, Hsin-Shu (TW)

( * ) Notice: Subject to any disclaimer, the term of this patent is extended or adjusted under 35 U.S.C. 154(b) by 135 days.

(21) Appl. No.: 11/550,019

(22) Filed: Oct. 17, 2006

(65) Prior Publication Data

US 2007/0274432 A1    Nov. 29, 2007

(30) Foreign Application Priority Data

May 23, 2006    (TW) .............................. 95118321 A

(51) Int. Cl.
G11C 19/00    (2006.01)

(52) U.S. Cl. .......................................... 377/64; 377/75

(58) Field of Classification Search .................. 377/64, 377/68, 75–81; 345/100
See application file for complete search history.

(56) References Cited

U.S. PATENT DOCUMENTS

| 5,949,271 | A | 9/1999 | Fujikura |
| 6,778,627 | B2 | 8/2004 | Yu |
| 6,834,095 | B2 | 12/2004 | Yu |
| 6,885,723 | B2 | 4/2005 | Yu |
| 7,317,780 | B2 * | 1/2008 | Lin et al. ........................ 377/67 |
| 2004/0165692 | A1 * | 8/2004 | Moon et al. ................... 377/64 |
| 2005/0220262 | A1 | 10/2005 | Moon |
| 2006/0291610 | A1 * | 12/2006 | Lo et al. ........................ 377/64 |
| 2007/0086558 | A1 * | 4/2007 | Wei et al. ...................... 377/64 |

* cited by examiner

*Primary Examiner*—Tuan T Lam
(74) *Attorney, Agent, or Firm*—Thomas, Kayden, Horstemeyer & Risley

(57) ABSTRACT

A shift register circuit includes a shift register unit and a buffer. The buffer is coupled to the output terminal of the shift register unit to delay the output signal from the shift register unit. The overlapped voltage of two output signals from two adjacent shift register units can be reduced.

14 Claims, 6 Drawing Sheets

SHIFT REGISTER CIRCUIT

RELATED APPLICATIONS

The present application is based on, and claims priority from, Taiwan Patent Application Serial Number 95118321, filed May 23, 2006, the disclosure of which is hereby incorporated by reference herein in its entirety.

1 Field of the Invention

The present invention relates to a shift register circuit, and more particularly, to a liquid crystal display shift register circuit.

2 Background of the Invention

FIG. 1 illustrates a conventional shift-register circuit as disclosed by U.S. Pat. No. 6,834,095. FIG. 1 shows a single shift-register unit. A plurality of shift-register units comprises a shift-register circuit. In this figure, the (N−1)out is a previous-stage signal from the output terminal of the previous-stage shift-register unit. The (N+1)out is a next-stage signal from the output terminal of the next-stage shift-register unit. The (N)out is a signal from the output terminal of the present shift-register unit.

FIG. 2 illustrates simulation results of the (N+1)out signal, the (N−1)out signal and the (N)out signal from three adjacent shift register units respectively. In the simulation, VDD is 15V, VSS is 0V, clock signals swing between 0V and 15V with 50% duty cycle, and transistor threshold voltage is set as 2V. From FIG. 2, an overlapped region exists between any two signals. FIG. 3 is an enlarged diagram of the overlapped region. From FIG. 3, the previous-stage signal (N+1)out and the present-stage signal (N)out are overlapped at 11 volts. Therefore, when signals form a shift register circuit are used to drive transistors with a 2 volt threshold voltage of a LCD for sampling data, a sampling error may occur because the overlapped voltage may turn two transistors on simultaneously.

SUMMARY OF THE INVENTION

Therefore, it is the main purpose of the present invention to provide a shift register circuit to minimize the voltage overlap between two output signals from two shift register units.

Another purpose of the present invention is to provide a shift register circuit to improve the sampling rates.

The problems outlined above are solved by the apparatus of the present invention. That is, the shift register circuit of the present invention includes a shift register unit and a buffer. The shift register unit is composed of two inverters and four transistors. The buffer is composed of four transistors.

According to an embodiment, these transistors are NMOS transistors.

According to an embodiment, each inverter is formed by two transistors connected in series, a first transistor having a gate for receiving the second signal and a first source/drain for receiving the third signal;

a second transistor having a gate coupled to a second source/drain of the first transistor and a first source/drain for receiving the first signal;

According to an embodiment, the shift register circuit of the present invention is controlled by a first signal, a second signal, a third signal and a fourth signal. The shift register circuit includes a first transistor having a gate for receiving the second signal and a first source/drain for receiving a third signal; a second transistor having a gate for receiving the first signal and a first source/drain coupled to a second source/drain of the first transistor; a third transistor having a first source/drain coupled to a second source/drain of the second transistor and a second source/drain for receiving a low level voltage; a fourth transistor having a first source/drain coupled to a second source/drain of the second transistor, a second source/drain for receiving a low level voltage and a gate for receiving the fourth signal; a first inverter having an input terminal for receiving the third signal; a second inverter having an input terminal coupled to a first source/drain of the fourth transistor and an output terminal coupled to a gate of the fourth transistor; a fifth transistor having a first source/drain coupled to an output terminal of the first inverter and a gate coupled to a second source/drain of the first transistor; a sixth transistor having a first source/drain coupled to a second source/drain of the fifth transistor, a second source/drain for receiving a low level voltage and a gate coupled to the output terminal of the second inverter; a seventh transistor having a first source/drain for receiving a high level voltage and a gate coupled to the second source/drain of the fifth transistor and a eighth transistor having a first source/drain coupled to a second source/drain of the seventh transistor, a second source/drain coupled to a low level voltage and a gate coupled to the output terminal of the second inverter.

According to an embodiment, the first signal is a clock signal, the second signal is an inverted clock signal, the third signal is an output signal from a previous-stage shift-register unit and the fourth signal an output signal from a next-stage shift-register unit.

According to an embodiment, each inverter is formed by two transistors connected in series.

According to an embodiment, the shift register circuit further comprises a delay circuit coupled to the fifth and the sixth transistor.

Accordingly, a buffer is located between two shift register units to enlarge the time period between two output signals from the two shift register units to minimize the overlapped region of these two output signals. Such shift register circuits may prevent two connected transistors turning on simultaneously and improve the differential efficiency when sampling.

BRIEF DESCRIPTION OF THE DRAWINGS

The foregoing aspects and many of the attendant advantages of this invention will become more readily appreciated and better understood by referencing the following detailed description, when taken in conjunction having the accompanying drawings, wherein.

DETAILED DESCRIPTION OF THE PREFERRED EMBODIMENTS

The shift register includes a shift register unit and a buffer. The buffer is coupled to the output terminal of the shift register unit to delay the output signal from this coupled shift register unit. Such delay may minimize the overlapped region between two output signals from two adjacent shift register units.

Figure 4:
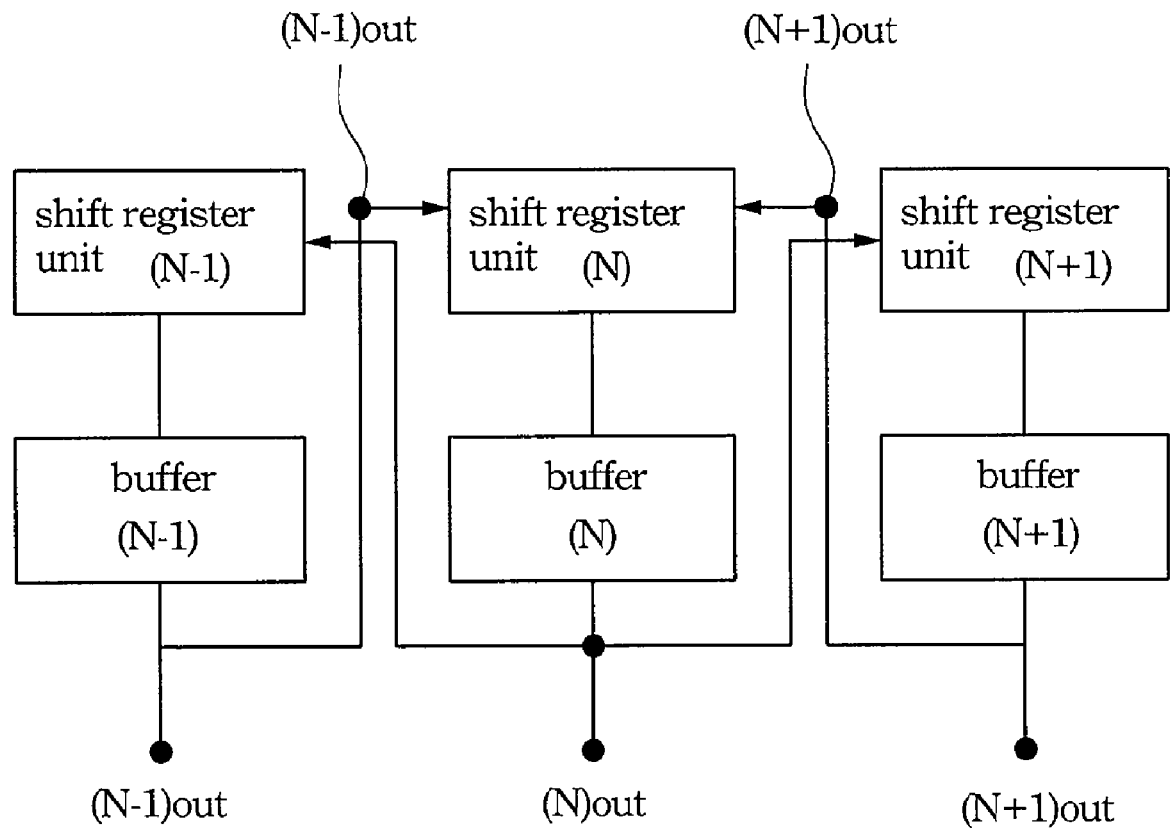
FIG. 4 illustrates a schematic block diagram of a shift register circuit of the present invention.

FIG. 4 illustrates a schematic block diagram of a shift register circuit of the present invention. A buffer is coupled to the output terminal of each shift register unit. For example, the buffer N is coupled to the output terminal of the shift register unit N. The output signal (N)out is a feedback signal sent to the shift register unit N−1 and is a input signal sent to the shift register unit N+1. The rest may be deduced by analogy.

Figure 5:
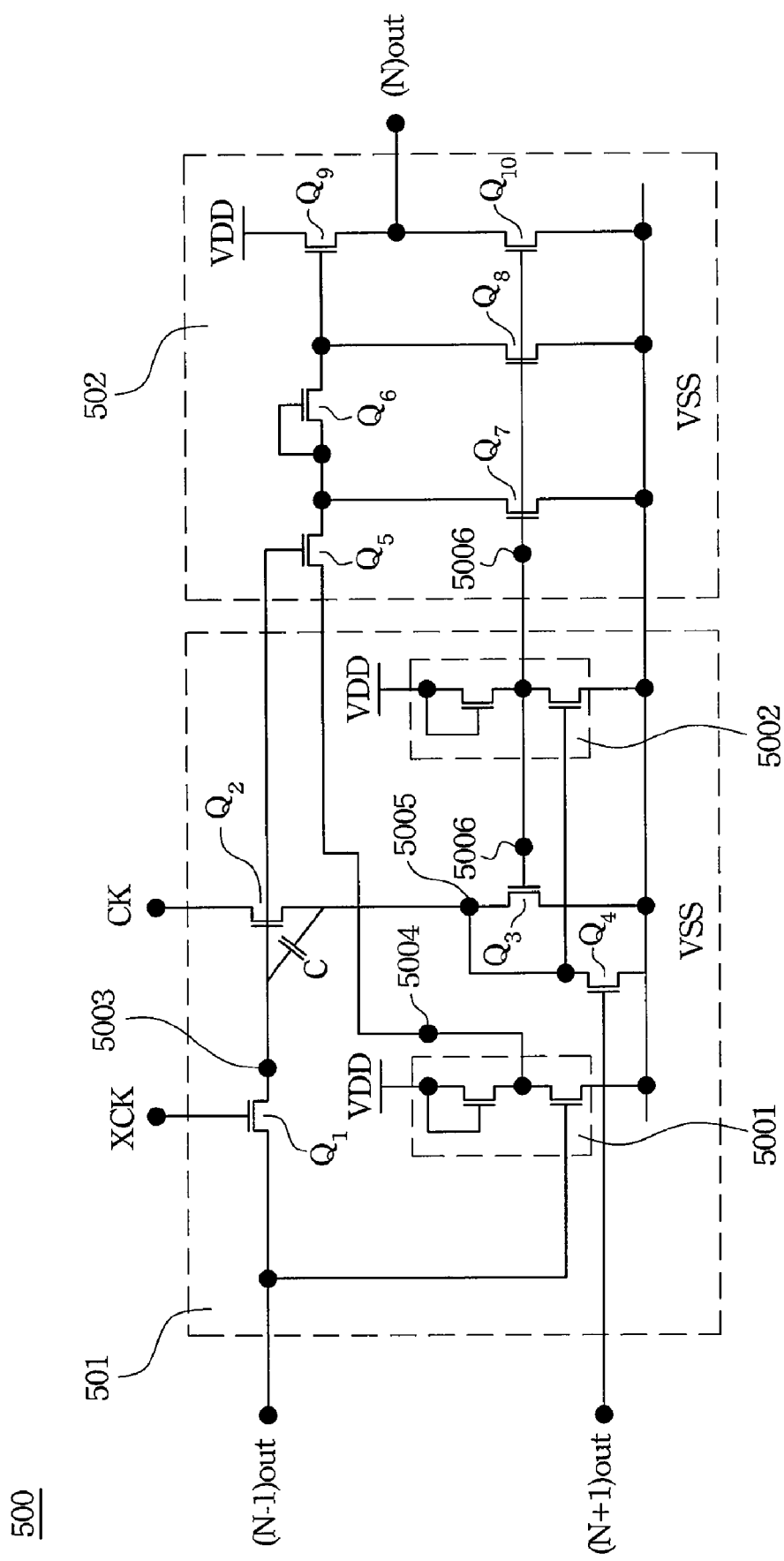
FIG. 5 illustrates a detailed circuit of a shift register of the present invention.

FIG. 5 illustrates a detailed circuit of a shift register of the present invention. The shift register 500 includes a shift register unit 501 and a buffer 502. The shift register unit 501 includes two inverters 5001 and 5002 and four transistors Q1, Q2, Q3 and Q4. The buffer 502 includes six transistors Q5, Q6, Q7, Q8, Q9 and Q10. In an preferred embodiments, the ten transistors are NMOS transistors. In other embodiments, the ten transistors can be PMOS transistors. Each of the two inverters are formed having two transistors connected in series. The gate and the source/drain of one of the two transistors are connected together.

This shift register unit 501 is controlled by the clock signal CK, the inverse clock signal XCK, the previous stage signal (N−1)out and the next-stage signal (N+1)out. The transistor Q1 has a gate coupled to the inverse clock signal XCK, a first source/drain coupled to the previous stage signal (N−1)out and a second source/drain coupled to the gates of the transistors Q2 and Q5 so as to switch the transistors Q2 and Q5 respectively. The transistor Q2 has a first source/drain coupled to the clock signal CK and a second source/drain coupled to the first source/drain of the transistors Q3 and Q4. The transistor Q3 has a gate coupled to the output terminal of the inverter 5002 and coupled to the gates of the transistors Q7, Q8 and 010 of the buffer 502 to switch the transistors Q7, Q8 and Q10. The second source/drain of the transistor Q3 is coupled to a low level voltage VSS. The transistor Q4 has a gate controlled by the next-stage signal (N+1)out, a first source/drain coupled to an input terminal of a inverter 5002 and a second source/drain coupled to a low level voltage VSS. The inverter 5001 receives and reverses a previous-stage signal (N−1)out and transfers the reversed signal to the first source/drain of the transistor Q5.

Figure 9:
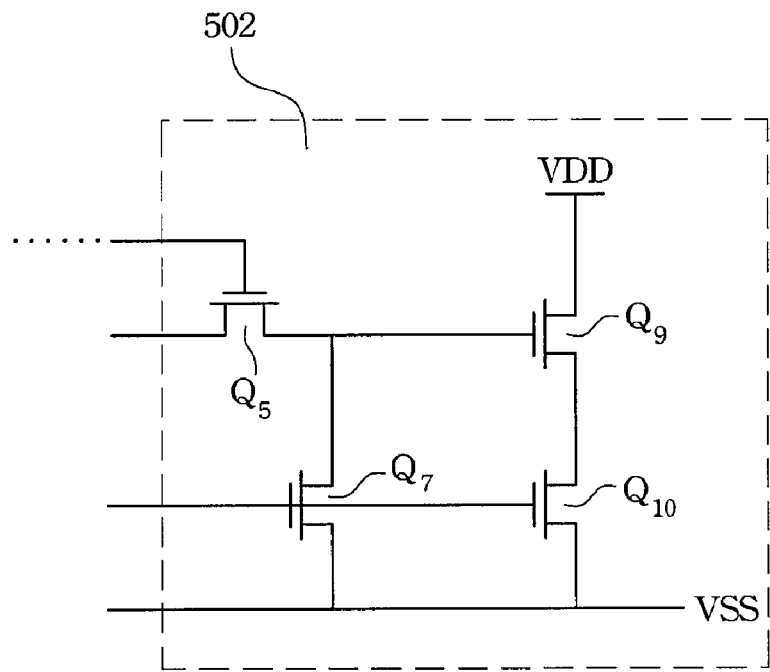
FIG. 9 and FIG. 10 illustrate is a diagram of the delay circuit according to the other embodiments.
Figure 10:
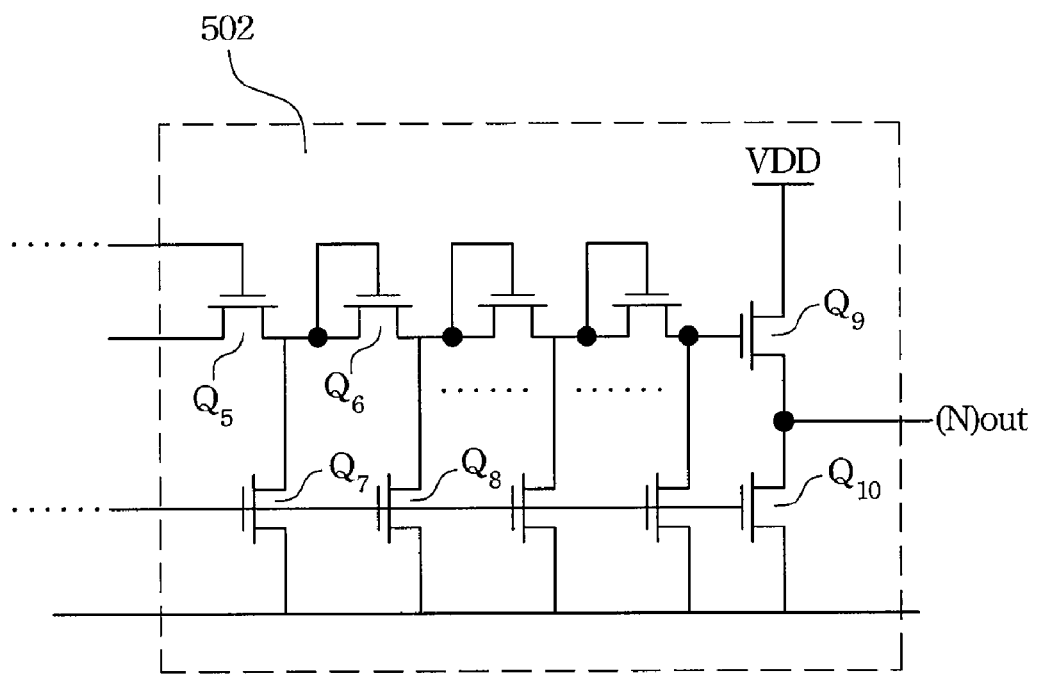

The buffer 502 is coupled to the second source/drain of the transistor Q1, the output terminal of the inverter 5001 and the output terminal of the inverter 5002. The switch of the transistors Q7, 08 and Q10 are controlled by the output terminal of the inverter 5002. The source/drain of these transistors are couplled to a low level voltage VSS. The first source/drain of the transistor Q7 is coupled to the connection point of the transistor Q5 and Q6. The transistor 08 has a first source/drain coupled to the second source/drain of the transistor Q6 and controls the switch of the transistor Q9. The transistor Q9 has a first source/drain coupled to a high level voltage VDD and a second source/drain coupled to the first source/drain of the transistor Q10. A delayed present-stage signal (N)out is outputted from the connection point of the transistor Q9 and Q10. The delay circuits composed of transistors in the buffer 502 may be added or removed based on the required delay time. For example, in an embodiment, the delay circuit composed of the transistor Q6 and the transistor Q8 may be removed to reduce the delay time. In this embodiment, the transistor Q5 is directly coupled to the transistor Q9 and the transistor Q7 is directly coupled to the transistor Q10 as shown in FIG. 9. Similarly, in an embodiment, the delay circuit composed of the transistor Q6 and the transistor Q8 may be added to the original buffer 502 to increase the delay time as shown in the FIG. 10.

Figure 6:
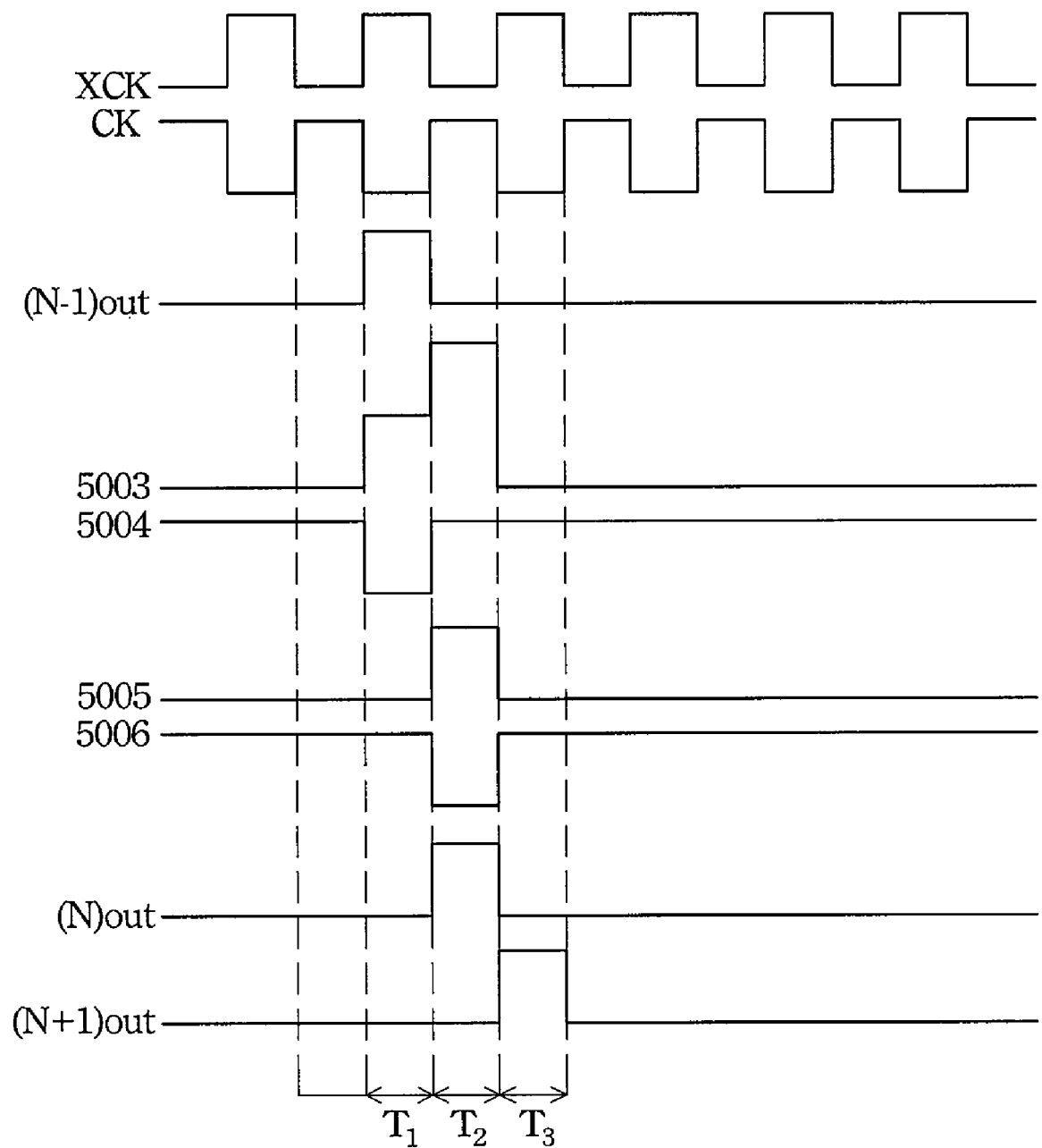
FIG. 6 illustrates a timing chart of the shift-register according to the embodiment of the present invention.

FIG. 6 illustrates a timing chart of the shift-register circuit according to the embodiment of the present invention. Please refer FIG. 5 and FIG. 6 together. In the time period T1, the inverse clock signal XCK is in a high level state and the clock signal CK is in a low level state. The high level inverse clock signal XCK may conduct the transistor Q1. The high level previous-stage signal (N−1)out is transferred to the end point 5003 through the transistor Q1. Therefore, the end point 5003 is also in a high level state to conduct the transistor Q2 and the transistor Q5. The low level clock signal CK is transferred to the end point 5005 through the transistor Q2. Therefore, the end point 5005 is also in a low level state. This low level state in the end point 5005 is transferred to the input terminal of the inverter 5002 and is inversed to a high level state outputted from the output terminal 5006 of the inverter 5002. On the other hand, the high level previous-stage signal (N−1)out is transferred to the inverter 5001 and is inversed to a low level state to output from the output terminal 5004 of the inverter 5001. The high level state in the output terminal 5006 may conduct the transistor Q7, Q8 and Q10 in the buffer 502. Therefore, a low level present-stage signal (N)out is outputted form the buffer 502. On the other hand, the low level next-stage signal (N+1)out outputted from the next-stage shift register unit is feedback for the gate of the transistor Q4. The transistor Q4 is still in an OFF state in the time period T1 because the next-stage signal (N+1)out is in a low level state.

In the time period T2, the inverse clock signal XCK is in a low level state and the clock signal CK is in a high level state. The low level inverse clock signal XCK may turn the transistor Q1 off to make the end point 5003 in a floating state. The floating state may conduct the transistor Q2 and transistor Q5. The high level clock signal CK is transferred to the end point 5005 through the transistor Q2. Therefore, the end point 5005 is also in a high level state. The high level state in the end point 5005 may increase the level state in the end point 5003 again through a parasitism capacitor C of the transistor Q2. Moreover, this high level state in the end point 5005 is transferred to the input terminal of the inverter 5002 and is inversed to a low level state to output from the output terminal 5006 of the inverter 5002. On the other hand, the low level previous-stage signal (N−1)out is transferred to the inverter 5001 and is inversed to a high level state to output from the output terminal 5004 of the inverter 5001. The high level state is transferred to and conducts the transistor Q6 through the transistor Q5. The conducted transistor Q6 may switch the transistor Q9 to an "on" state. At this time, a high level present-stage signal (N)out, VDD, is outputted forms the buffer 502. On the other hand, the low level next-stage signal (N+1)out outputted from the next-stage shift register unit is feedback for the gate of the transistor Q4. The transistor Q4 is still in an OFF state in the time period T2 because the next-stage signal (N+1)out is in a low level state.

In the time period T3, the inverse clock signal XCK is in a high level state, the clock signal CK is in a low level state, the previous stage signal (N−1)out is in a low level state and the next-stage signal (N+1)out is in a high level state. The high level inverse clock signal XCK may conduct the transistor Q1. At this time, the end point 5003 is coupled to the low level previous stage signal (N−1)out through the transistor Q1. Therefore, the end point 5003 is also in a low level state to turn off the transistor Q2 and the transistor Q5. Moreover, the low level previous-stage signal (N−1)out is transferred to the inverter 5001 and is inversed to a high level state to output from the output terminal 5004 of the inverter 5001. The high level next-stage signal (N+1)out may turn on the transistor Q4. At this time, the end point 5005 is coupled to a low level voltage VSS through the transistor Q4. Therefore, the end point 5005 is also in a low level state. This low level state in the end point 5005 is transferred to the input terminal of the inverter 5002 and is inversed to a high level state to output from the output terminal 5006 of the inverter 5002. The high level state in the output terminal 5006 may conduct the transistor Q7, Q8 and Q10 in the buffer 502. Therefore, a low level present-stage signal (N)out is outputted from the buffer 502.

According to the present invention, the present-stage signal (N)out is sent out through the buffer 502 not directly through the shift register unit 501. Therefore, an increased time period exists between the previous-stage signal (N−1) out and the present-stage signal (N)out to reduce the overlapped voltage. On the other hand, the present-stage signal (N)out is sent to the shift register unit N+1 as its previous-stage input signal and is sent to the shift register unit N−1 as its next-stage input signal.

Figure 1:
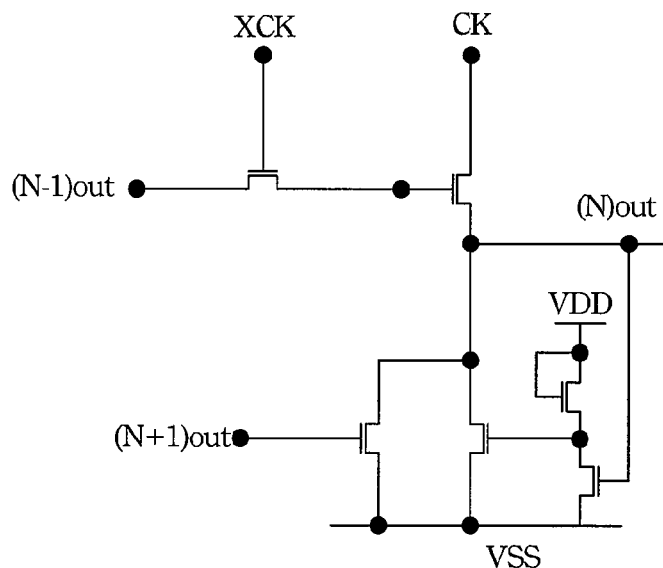
FIG. 1 illustrates a schematic diagram of a typical shift register unit.
Figure 2:
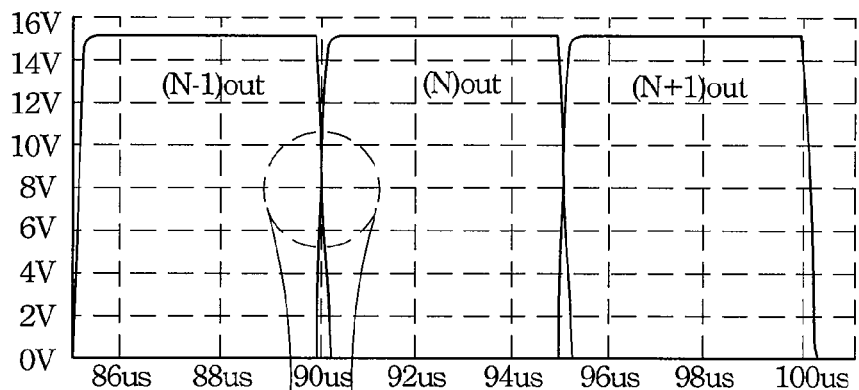
FIG. 2 illustrates simulation results of three signals outputted from three connected shift register units respectively.
Figure 3:
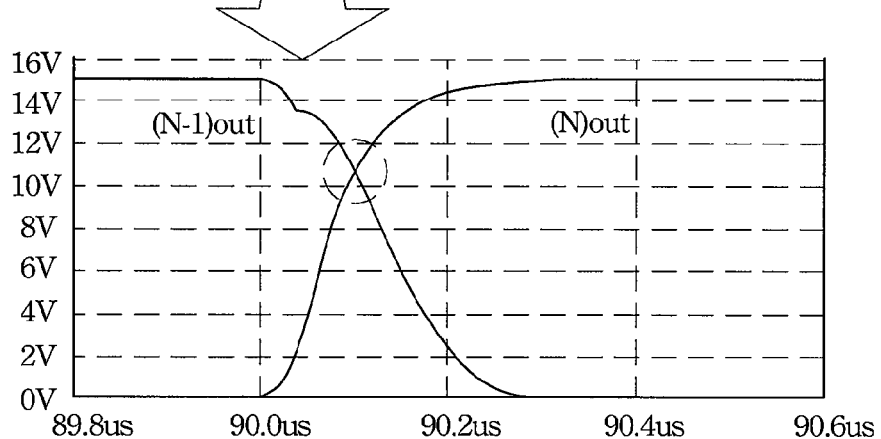
FIG. 3 illustrates an enlarged diagram of an overlapped region between two signals.
Figure 7:
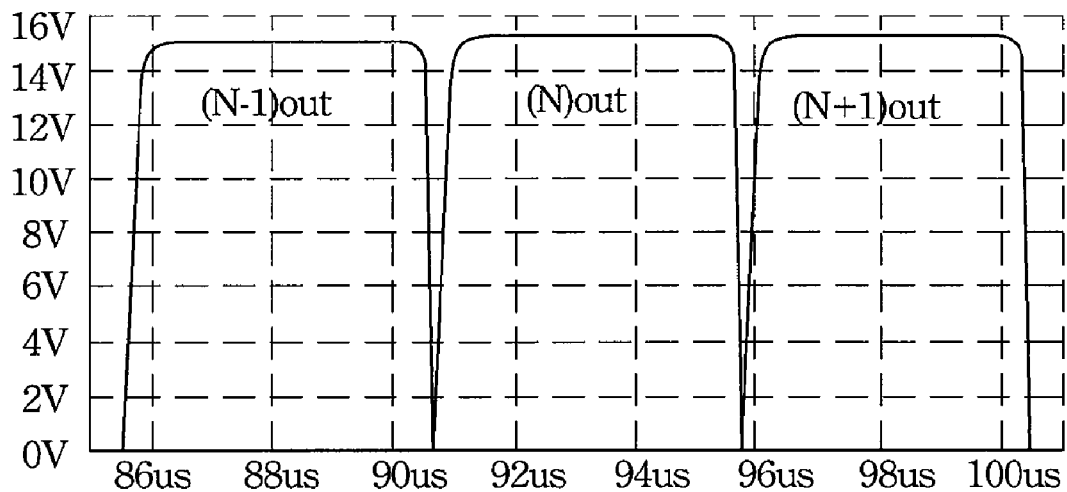
FIG. 7 illustrates simulation results of three signals outputted from three connected shift register units according to the present invention respectively.
Figure 8:
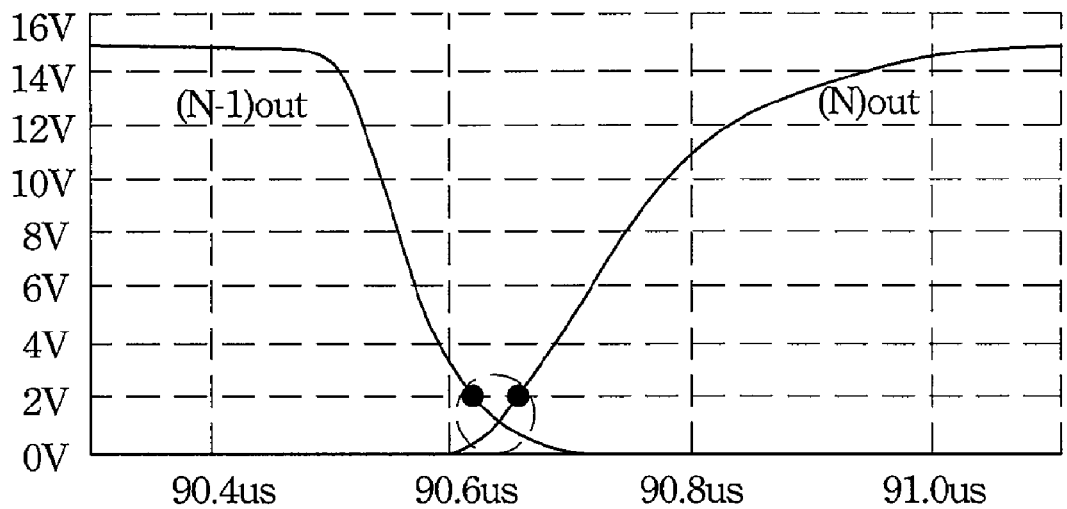
FIG. 8 illustrates an enlarged diagram of an overlapped region between two signals according to the present invention.

FIG. 7 illustrates simulation results of three signals outputted from three connected shift register units according to the present invention respectively. In the simulation, VDD is 15V, VSS is 0V, clock signals swing between 0V and 15V with 50% duty cycle, and transistor threshold voltage is set as 2V. FIG. 8 illustrates an enlarged diagram of an overlapped region between two signals. Comparing with the FIG. 2, the overlapped voltage is reduced from 11 volts to 1.5 volts. Therefore, the shift register circuit of the present invention may prevent two transistors from being turned on simultaneously that may result in a sampling error.

Accordingly, a buffer is coupled to an output terminal of each shift register unit to enlarge the time period between two output signals. Therefore, the overlapped voltage of these two output signals from the two shift register units may be reduced. Such shift register circuits may prevent two connected transistors being turned on simultaneously and improve the differential efficiency when sampling.

As is understood by a person skilled in the art, the foregoing descriptions of the preferred embodiment of the present invention are an illustration of the present invention rather than a limitation thereof. Various modifications and similar arrangements are included within the spirit and scope of the appended claims. The scope of the claims should be accorded to the broadest interpretation so as to encompass all such modifications and similar structures.

What is claimed is:

1. A shift register circuit controlled by a first signal, a second signal, a third signal, and a fourth signal, the shift register circuit comprising:
a first transistor having a gate for receiving the second signal and a first source/drain for receiving the third signal;
a second transistor having a gate coupled to a second source/drain of the first transistor and a first source/drain for receiving the first signal;
a third transistor having a first source/drain coupled to a second source/drain of the second transistor and a second source/drain for receiving a low level voltage;
a fourth transistor having a first source/drain coupled to a second source/drain of the second transistor, a second source/drain for receiving the low level voltage and a gate coupled to the fourth signal;
a first inverter having an input terminal for receiving the third signal;
a second inverter having an input terminal coupled to a first source/drain of the fourth transistor, and an output terminal coupled to a gate of the third transistor;
a fifth transistor having a first source/drain coupled to an output terminal of the first inverter, and a gate coupled to a second source/drain of the first transistor;
a sixth transistor having a first source/drain coupled to a second source/drain of the fifth transistor, a second source/drain for receiving the low level voltage, and a gate coupled to the output terminal of the second inverter;
a seventh transistor having a first source/drain for receiving a high level voltage, and a gate coupled to the second source/drain of the fifth transistor; and
an eighth transistor having a first source/drain coupled to a second source/drain of the seventh transistor, a second source/drain for receiving the low level voltage, and a gate coupled to the output terminal of the the second inverter.

2. The shift register circuit of claim 1, wherein all the transistors are either NMOS transistors or PMOS transistors.

3. The shift register circuit of claim 1, wherein the first signal is a clock signal.

4. The shift register circuit of claim 1, wherein the second signal is an inverted clock signal.

5. The shift register circuit of claim 1, wherein the first signal and the second signal are inverted.

6. The shift register circuit of claim 1, wherein the the third signal is an output signal from a previous-stage shift register circuit.

7. The shift register circuit of claim 1, wherein the the fourth signal is an output signal from a next-stage shift register circuit.

8. The shift register circuit of claim 1, further comprising a delay circuit electrically coupled to the fifth transistor and the sixth transistor.

9. The shift register circuit of claim 8, wherein the delay circuit comprises:
a ninth transistor having a first source/drain coupled to a gate of the the ninth transistor and coupled to a second source/drain of the the fifth transistor, and a second source/drain coupled to the gate of the the seventh transistor; and
a tenth transistor having a first source/drain coupled to a second source/drain of the the ninth transistor, a second source/drain for receiving the the low level voltage, and a gate coupled to an output terminal of the the second inverter.

10. The shift register circuit of claim 8, wherein all the transistors are either NMOS transistors or PMOS transistors.

11. The shift register circuit of claim 1, wherein the first inverter comprises:
an eleventh transistor having a first source/drain coupled to a gate of the eleventh transistor and for receiving the the high level voltage, and a second source/drain coupled to a first source/drain of the the fifth transistor; and
a twelfth transistor having a first source/drain coupled to the second source/drain of the the eleventh transistor, a second source/drain for receiving the the low level voltage, and a gate coupled to the the third signal.

12. The shift register circuit of claim 11, wherein all the transistors are either NMOS transistors or PMOS transistors.

13. The shift register circuit of claim 1, wherein the first inverter comprises:

a thirteenth transistor having a first source/drain coupled to a gate of the thirteenth transistor and for receiving the the high level voltage and a second source/drain coupled to a gate of the the third transistor and a gate of the the sixth transistor; and a fourteenth transistor having a first source/drain coupled to a second source/drain of the the thirteenth transistor, a second source/drain for receiving the the low level voltage, and a gate coupled to a first source/drain of the fourth transistor.

14. The shift register circuit of claim 13, wherein all the transistors are either NMOS transistors or PMOS transistors.

* * * * *